(12) United States Patent
Ghisu et al.

(10) Patent No.: US 8,947,150 B2
(45) Date of Patent: Feb. 3, 2015

(54) HIGH-VOLTAGE MULTI-LEVEL SHIFTER FOR ULTRASOUND APPLICATIONS AND TRANSMIT/RECEIVE CHANNEL FOR ULTRASOUND APPLICATIONS USING SAID LEVEL SHIFTER

(71) Applicant: STMicroelectronics S.r.l., Agrate Brianza (IT)

(72) Inventors: Davide Ugo Ghisu, Milan (IT); Sandro Rossi, Pavia (IT); Antonio Ricciardo, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/256,689

(22) Filed: Apr. 18, 2014

(65) Prior Publication Data

US 2014/0312954 A1    Oct. 23, 2014

(30) Foreign Application Priority Data

Apr. 23, 2013 (IT) ............................. MI2013A0662

(51) Int. Cl.
*H03L 5/00* (2006.01)
*H03K 3/356* (2006.01)

(52) U.S. Cl.
CPC ............................. *H03K 3/356113* (2013.01)
USPC ...................................................... 327/333

(58) Field of Classification Search
USPC ...................................................... 327/333
See application file for complete search history.

(56) References Cited

U.S. PATENT DOCUMENTS 8,149,017 B2 * 4/2012 Knierim .......................... 326/80
2006/0220675 A1 10/2006 Tripathi et al.
2009/0066372 A1 3/2009 La Placa et al.

OTHER PUBLICATIONS

Graf, *Amplifier Circuits*, Newnes, Boston, 1997, Chap. 3, "Instrumental Amplifiers," pp. 47-73. (30 pages).

* cited by examiner

*Primary Examiner* — Daniel Rojas
(74) *Attorney, Agent, or Firm* — Seed IP Law Group PLLC

(57) ABSTRACT

A multi-level shifter includes a first branch having first and second transistors coupled between a higher voltage terminal and a lower voltage terminal. The multi-level shifter comprises a second branch, in parallel with the first branch, having: a third transistor, coupled between said higher voltage reference terminal and an output node, a fourth switching transistor coupled between said output node and said lower voltage terminal. Said third and fourth transistors have respective control terminals controlled by drain terminals of said first and second transistors, respectively. The shifter includes a bidirectional battery coupled between said drain terminals of said first and second transistors to supply first and second voltages having the same magnitude and different polarities. Said fourth transistor is controlled according to the first voltage when said first transistor is turned on and said third transistor is controlled according to the second voltage when said second transistor is turned on.

23 Claims, 4 Drawing Sheets

HIGH-VOLTAGE MULTI-LEVEL SHIFTER FOR ULTRASOUND APPLICATIONS AND TRANSMIT/RECEIVE CHANNEL FOR ULTRASOUND APPLICATIONS USING SAID LEVEL SHIFTER

BACKGROUND

1. Technical Field

The present disclosure relates to a multi-level shifter for ultrasound applications and a transmit/receive channel for ultrasound applications using said level shifter.

Particularly, the present disclosure relates to a high-voltage multi-level shifter for ultrasound applications coupled between a connecting terminal and an output terminal of a transmit channel, of the type comprising at least one first and one second communication transistors, coupled in series with each other between the connecting terminal and the output terminal.

The disclosure also relates to a transmission channel of the type comprising at least one high-voltage multi-level shifter as described above, e.g., for use in an ultrasound imaging or ultrasonography.

2. Description of the Related Art

An ultrasound or sonographic machine is known to be a medical diagnostic testing system that uses ultrasonic waves or ultrasounds and is based on the principle of ultrasound transmission and echo emission analysis and is widely used in internal medicine, surgery and radiology.

Typically used ultrasounds range from 2 to 20 MHz.

Frequency is selected considering that higher frequencies have a greater image resolving power, but penetrate to a shallower depth in the individual under examination.

These ultrasounds are typically generated by a piezoceramic crystal in a probe that in kept in direct contact with the skin of the individual with the interposition of an appropriate gel (which is adapted to eliminate air between the probe and the skin of the individual, thereby allowing ultrasounds to penetrate the anatomic region being examined).

The probe can collect a return signal, or echo, which is appropriately processed by a computer and displayed on a monitor. Particularly, ultrasounds that reach an acoustic impedance variation point, such as an internal organ, are partially reflected and the percentage reflection provides information about impedance differences between the penetrated tissues.

The time that an ultrasonic wave takes to run its path of propagation, reflection and return is provided to the computer, which calculates the depth from which the echo is emitted, and thus identifies the boundary surface between the penetrated tissues (which corresponds to the acoustic impedance variation point and hence to the depth from which the echo is emitted).

A typical transmit/receive or TX channel that is used in these applications is schematically shown in FIG. 1 and generally designated by numeral 1.

Particularly, the transmit/receive channel 1 comprises a high voltage multi-level shifter 2 of the type comprising a branch 4 coupled between a first terminal HVP connected to a positive voltage, and a second terminal HVM, connected to a negative voltage.

In the illustrated example, the shifter 2 allows switching between two levels, i.e., the high level, corresponding to the voltage of the first terminal HVP and the low level HVM.

Typical values for the terminal HVP connected to a positive voltage range from 5V to 100V, whereas typical values for the terminal HVM connected to a negative voltage range from −5V to −100V.

The voltage of the output terminal HVout of the level shifter 2 is clamped by a clamping block 5 to a reference voltage, in this example the ground voltage GND.

The clamping block 5 is substantially a high-voltage switch coupled between said output terminal HVout of the level translator 2 and said ground voltage GND, and controlled by a first control signal INC.

The output terminal HVout, which corresponds to a first output terminal of the transmission channel 1, is connected to a connection terminal Xdcr for the piezoelectric transducer to be controlled by the transmission channel 1.

Conveniently, an anti-noise block 3, comprising two anti-parallel diodes, is coupled between the output terminal HVout of the level shifter 2 and the connection terminal Xdcr.

The anti-noise block 3, known as anti-noise diodes, allows the stray capacitances of the half-bridge of the level shifter 2 to be isolated from the connection terminal Xdcr during reception by the transmission channel 1.

A transmit/receive (T/R) switch 6 or transmit/receive switch is coupled between the connecting terminal Xdcr and a low-voltage output terminal LVout of the transmission channel 1. During reception by the transmission channel 1, the receive switch 6 is actuated and transmits the received signal to the low-voltage output terminal LVout.

The low-voltage output terminal LVout is connected to an amplifier LNA which allows amplification of the signals or echoes received by the piezoelectric transducer after pulse transmission.

The receive signal, after appropriate processing, will allow an image to be displayed on a screen, not shown.

It shall be noted that the receive switch 6 is of the high-voltage type even if the receive signal is generally a low-voltage signal, because the piezoelectric transducer connected to the transmission channel 1 detects small return echoes of ultrasound pulse signals.

Nevertheless, the receive switch 6 should fulfill two apparently opposite specifications: it should be of high-voltage type during transmission by the transmission channel 1, in which the level shifter 2 has times ranging from tens to hundreds of nanoseconds, and it should operate at low voltages during reception, where reception may take a few hundreds of microseconds.

Furthermore, the receive switch 6 and the clamping block 5 are generally formed as two separate chips, particularly located in a receive chip ad a transmit chip or, if present in the same chip, they are separately formed to properly fulfill their respective specifications.

More in detail, the high-voltage shifter 2 comprises a first branch, having a first switching transistor M1 and a second switching transistor M2, which are coupled with each other between the first higher voltage reference terminal HVP and the first lower voltage reference terminal HVM. The first and second transistors M1 and M2 have respective control terminals connected to and controlled by first DRM1 and second DRM2 input drivers, and the respective drain terminals connected together.

It shall be noted that the first switching transistor M1 is a high-voltage P-channel MOS transistor (HV PMOS), and the second switching transistor M2 is a high-voltage N-channel MOS transistor (HV NMOS).

Therefore, in classical ultrasonic solutions, the level shifter is obtained using asymmetric output stages (NMOS and PMOS) which inevitably generate a second harmonic distortion.

Thus, when the circuit 1 is switched from a high-voltage level (e.g., HVP) to a low-voltage level (e.g., HVM) or vice versa, the shifter 2, which is constructed with MOS transistors of different types (NMOS vs PMOS), has different transitions to the output terminal HVout depending on whether the shifter is switched to a high-voltage value or a low-voltage value.

This asymmetry in the rising or falling edge of the voltage signal to the terminal HVout causes a second harmonic component to be introduced into the emitted signal, and thus disturb later second-harmonic analysis on the reflected echo.

Generally, this asymmetry may be minimized according to the current/voltage characteristics of the two NMOS and PMOS transistors, by having them operate in appropriate range of operating conditions (such as output load and operating voltage).

Nevertheless, this optimization is not stable and accurate and especially, with changing operating conditions, it may lead to a considerable degradation of performances, possibly to 10 db lower attenuation of the transmitted second harmonic component.

This introduced asymmetry particularly affects the percentage of the reflected acoustic signal, which carries information about the difference in impedance between the penetrated tissues.

This second harmonic distortion is tolerated (in non-high-quality applications), when it is attenuated by about 30-40 db with respect to the value of the carrier of the generated acoustic signal.

Nevertheless, due to this distortion, the images of the region to be observed are generated with a resolution that is lower than the one that might be obtained without such asymmetry.

BRIEF SUMMARY

One embodiment of the disclosure is a high-voltage multi-level shifter for ultrasound applications, that can provide a substantially symmetric transition of the voltage value at its output terminal, to limit the introduction of a second-harmonic asymmetry.

One embodiment of the disclosure is a transmit/receive channel for ultrasound applications that uses the high-voltage multi-level shifter to generate better defined images (with improved resolution) and/or identify the conformation of the internal organ with higher accuracy.

In one embodiment, which uses, for instance, a shifter with two, three or five levels (or more than five levels), a transmit/receive channel may be obtained, in which switching is carried out by a NMOS transistor for one half and by a PMOS transistor for the other half, which will make the structure inherently symmetrical.

An advantage of one embodiment of the present disclosure is that the area covered by the shifter is, to a first approximation, equal to that covered by a traditional shifter, and the symmetry of signals is ensured regardless of the supply voltage and, to a first approximation, regardless of the load.

Finally, another advantage of one embodiment of the present disclosure is that the transmit/receive channel that uses the two-, three- or five-level shifter is self-protected from current recirculation from the output terminal.

BRIEF DESCRIPTION OF THE SEVERAL VIEWS OF THE DRAWINGS

The characteristics and advantages of the present disclosure will appear from the following detailed description of a possible practical embodiment, illustrated as a non-limiting example in the set of drawings, in which.

DETAILED DESCRIPTION

Although this is not expressly shown, the individual features described with reference to each embodiment shall be intended as auxiliary and/or interchangeable with other features, as described with reference to other embodiments.

The present disclosure relates to a transmit/receive channel for ultrasound applications that uses a high-voltage multi-level shifter.

Parts that have been described with reference to the prior art will be designated hereinbelow, for simplicity, by the same numerals.

Figure 1:
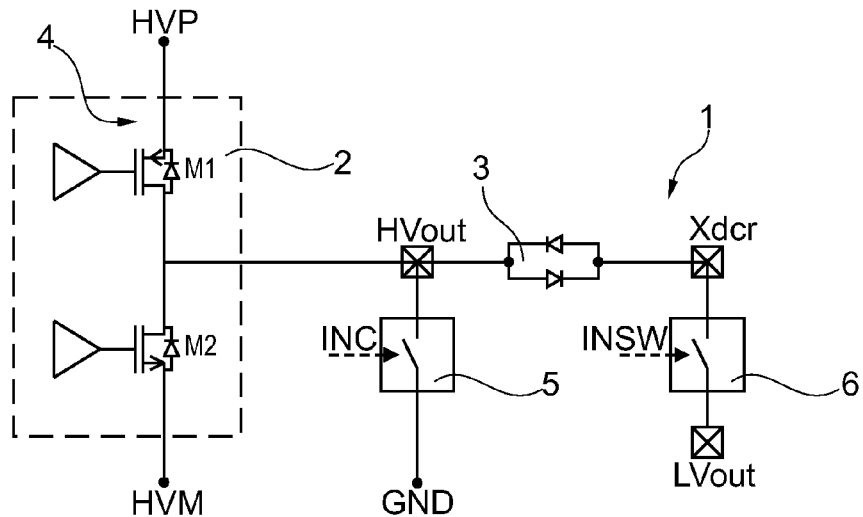
FIG. 1 shows a prior art transmit/receive circuit for ultrasound applications.
Figures 2, 2A:
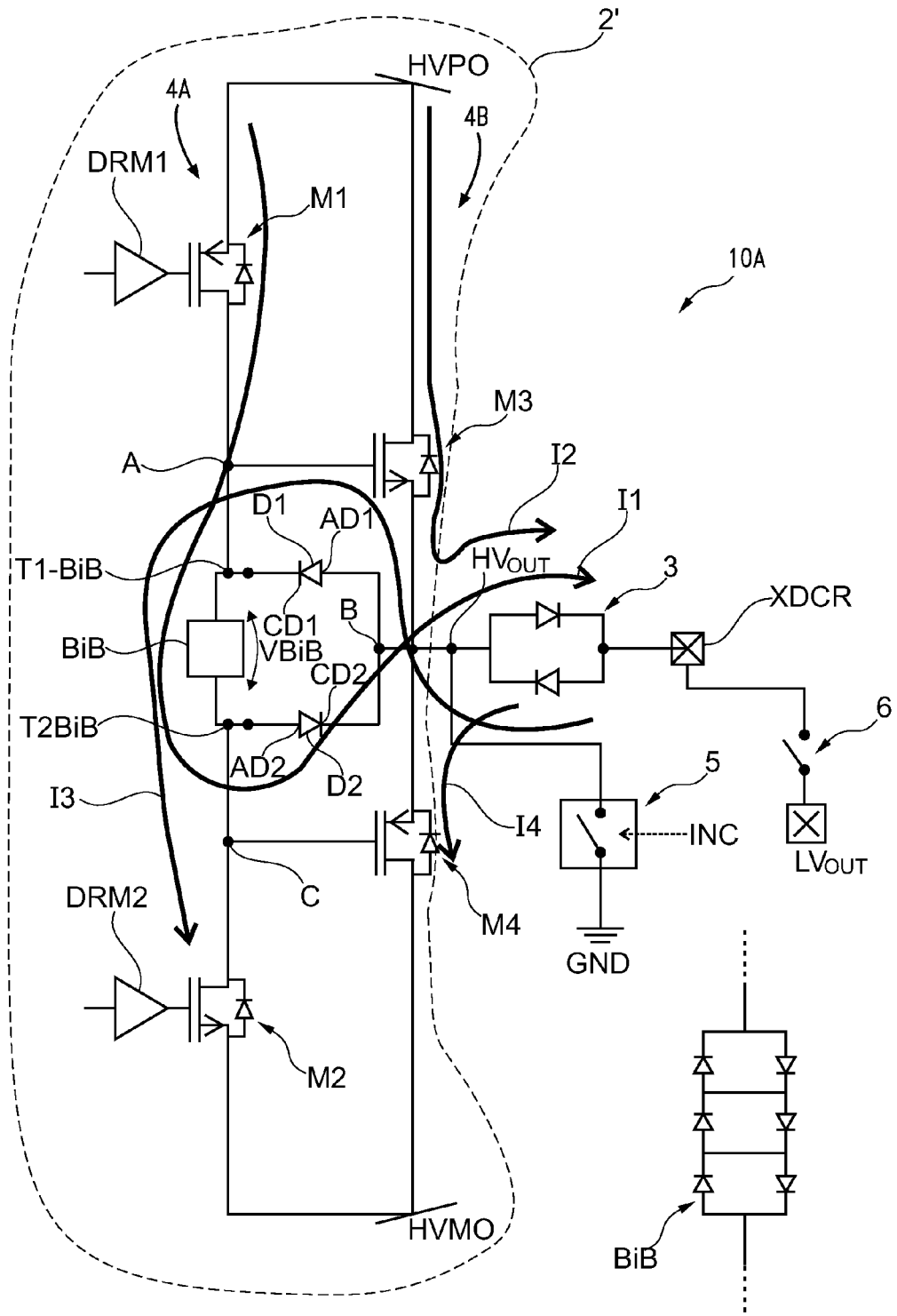
FIG. 2 shows a first embodiment of the transmit/receive circuit for ultrasound applications, comprising the high-voltage multi-level shifter of the present disclosure.
FIG. 2A shows an embodiment of a component of the high-voltage multi-level shifter of FIG. 2.

Referring to FIG. 2, a transmit/receive channel 10A includes the anti-noise block 3, clamping block 5, and T/R switch 6 of the transmit/receive channel 1 of FIG. 1. In addition, the transmit/receive channel 10A includes a multi-level shifter 2' having a first branch 4A and a second branch 4B connected in parallel to the first branch. Like the branch 4 of FIG. 1, the first branch 4A includes the first switching transistor M1 and the second switching transistor M2 coupled with each other between the first higher voltage reference terminal HVP and the first lower voltage reference terminal HVM. The first and second transistors M1 and M2 have respective control terminals connected to and controlled by the first and second input drivers DRM1, DRM2, respectively, and respective drain terminals connected together.

The second branch 4B includes:
a third switching transistor M3, coupled between the first higher voltage reference terminal HVP0 and the output node HVout, and
a second switching transistor M4 coupled between said output node HVout and said first lower voltage reference terminal HVM0.

Particularly, the third and fourth switching transistors M3 and M4 have respective control terminals (or gate terminals) connected to and controlled by the drain terminals of the first switching transistor M1 and the second switching transistor M2 respectively, It shall be noted that the third switching transistor M3 is a high-voltage N-channel MOS transistor (High Voltage or HV NMOS), and the fourth switching transistor M4 is a high-voltage P-channel MOS transistor (HV PMOS).

Particularly, in one aspect of the present disclosure, the first and fourth transistors M1 and M4 are MOS transistors configured as having the same current-carrying capacity, and the second and third transistors M2 and M3 are MOS transistors configured as having the same current-carrying capacity.

Preferably, in a peculiar aspect of the present disclosure, in view of optimizing the performances of the multi-level shifter 2', the four transistors M1, . . . , M4 may be all dimensioned to have the same current-carrying capacity.

This arrangement considerably improves symmetry at the end of the switching process and is especially advantageous in terms of area covered by the four transistors M1, . . . , M4.

In other words, these transistors M1, M2, M3 and M4 are designed and implemented with the same current-carrying capacity, e.g., as MOS transistors with a source drain voltage of 100V or 200V.

The first branch 4A of the multi-level shifter 2' comprises a bidirectional battery BiB coupled between the drain terminals of the first switching transistor M1 and the second switching transistor M2.

Particularly, the bidirectional battery BiB has a first terminal T1-BiB connected with the drain terminal of the first switching transistor M1 and a second terminal T2-BiB connected with the drain terminal of the second switching transistor M2.

The bidirectional battery BiB is configured to supply two voltage values VBiB_1 and VBiB_2 having the same magnitude and different polarities, i.e., |VBiB_1|=−|VBiB_2|.

In a preferred embodiment, also referring to FIG. 2A, the bidirectional battery BiB comprises an antiparallel arrangement of low-voltage diodes, for example three diodes.

Particularly, the first voltage VBiB_1 is supplied by the bidirectional battery BiB when the transition of the output terminal HVout is from a low voltage value, e.g., HVM0 to a high voltage value, e.g., HVP0, whereas the second voltage VBiB_2 is supplied by the battery BiB when the transition of the output terminal HVout is from a high voltage value, e.g., HVP0 to a low voltage value, e.g., HVM0.

The multi-level shifter 2' comprises a first low-voltage diode D1 having a cathode terminal CD1 connected to the drain terminal of the first transistor M1 (and hence also to the first terminal T1-BiB of the battery BiB), and an anode terminal AD1 connected to the output node HVout and a second, and a second low-voltage diode D2 having a cathode terminal CD2 connected to the output node HVout and an anode terminal AD2 connected to the drain terminal of the second transistor M2 (and hence also to the second terminal T2-BiB of the battery BiB).

Preferably, the first diode D1 and the second diode D2 are low-voltage diodes constructed with identical electric specifications.

It will be appreciated that, in the preferred embodiment of the multi-lever shifter 2', since the diodes D1 and D2 are identical, the voltages at their ends will have the same value, i.e., V_D1 equal to V_D2.

Therefore, the two voltage values may have the same magnitude and different polarities, depending on the transition occurring in the shifter 2', i.e., |VBiB_1|=−|VBiB_2|.

Concerning the operation of the multi-level shifter 2' which, as shown in this FIG. 2, allows shifting or switching between two levels, i.e., a high level substantially equal to the voltage value of the first positive reference terminal HVP0 and another level substantially equal to the voltage value of the first negative reference terminal HVM0, it will be noted that, in the condition in which the gate-source voltage Vgs_M1 is equal to the gate-source voltage Vgs_M2 and both are zero, then the output terminal Xdcr of the transmit/receive channel 1 is at zero voltage.

When the transistor M1 is turned on through the driver DRM1 and its gate-source voltage Vgs_M1 is forced to a voltage VDD, where VDD is the control voltage for such transistor M1 (e.g., 3V or 5V), a current I1 starts to flow between the nodes A (or terminal HVout) and B, thereby developing a voltage which is a function of the voltage VBiB_1 supplied by the bidirectional battery BiB.

Since the node A represents the control or gate terminal of the transistor M3 and the node B represents the source terminal of such transistor M3, then the latter will be in a conduction state (Vgs_M3 equal to VDD), with a current I2 flowing toward the output Xdcr.

Particularly, due to the presence of the diode D1, the control voltage for the transistor M3 is equal to VBiB_1+V_D1=VDD.

It shall be noted that the voltage at the node C is designed to be higher than the voltage at the node B, and hence the MOS M4 is certainly off.

The shifter 2' ends its switching process when the output terminal Xdcr reaches the first positive voltage value HVP0.

It shall be noted that the last part of the switching process from HVP0-VDD to HVP0) is carried out by the transistor M1 only, because the transistor M3 is being turned off.

When the value at the output terminal HVout has to be switched from high to low, then the switching transistor M1 is turned off (by setting a zero gate-source voltage, Vgs_M1=0) and the switching transistor M2 is turned on (by setting a gate-source voltage equal to the control voltage −VDD that is set through the driver DRM2, Vgs_M2=VDD) and a current I3 starts to flow, developing a voltage between the nodes B and C which is a function of the voltage VBiB_2 supplied by the bidirectional battery BiB.

Particularly, due to the presence of the diode D2, the control voltage for the transistor M4, imposing the voltage VBiB_2, is equal to VBiB_2−V_D2=−VDD, i.e., VDD=−VBiB_2+V_D2 with |VBiB_1|=−|VBiB_2|. VBiB_1+V_D1=VDD.

This voltage −VDD turns on the switching transistor M4 with a gate-source voltage of VDD, and a current I4 starts to flow.

It shall be noted that the voltage at the node A is designed to be lower than that at the node B, and hence the switching transistor M3 is certainly off.

The last part of the switching process (from HVM0+VDD to HVM0) is only carried out by the switching transistor M3.

Since the transistors M1 and M2 have the same current-carrying capacity, these last portions of the switching process may also become symmetrical, thereby ensuring optimal performance throughout the switching range.

The advantages of the shifter 2' over the conventional configuration are self-evident, as in the shifter 2' of the present disclosure both switching processes to the high voltage value and the low voltage values are carried out by NMOS transistors for one half and by PMOS transistors for the other half.

Particularly, the transition to the first positive voltage level HVP0 or high level is ensured by the transistors M1 and M3 (one of NMOS type and the other of PMOS type), whereas the transition to the first negative voltage level HVP0 or low level is ensured by the transistors M2 and M4 (one of NMOS type and the other of PMOS type).

This will make the structure of the shifter 2' inherently symmetrical, and will ensure symmetry of transitions, thereby reducing the introduction of second harmonic noise.

Advantageously, in the shifter 2' of the present disclosure, a transistor area, with the switching transistors M1, M2, M3 and M4 is equal, to a first approximation, to that of the conventional structure, since these four switching transistors M1, M2, M3 and M4 have the same current-carrying capacity, but a lower current-carrying capacity, i.e., one half of the current-carrying capacity of the MOS transistors implemented in the conventional structure.

It shall be noted that the transition symmetry is ensured regardless of the supply voltage and, to a first approximation, also regardless of the load.

Finally, the shifter 2' of the present disclosure is self-protected from current recirculation from the output, due to the presence of the drain-source diodes of the MOS transistors M3 and M4, like the shifter with the conventional structure.

Figure 3:
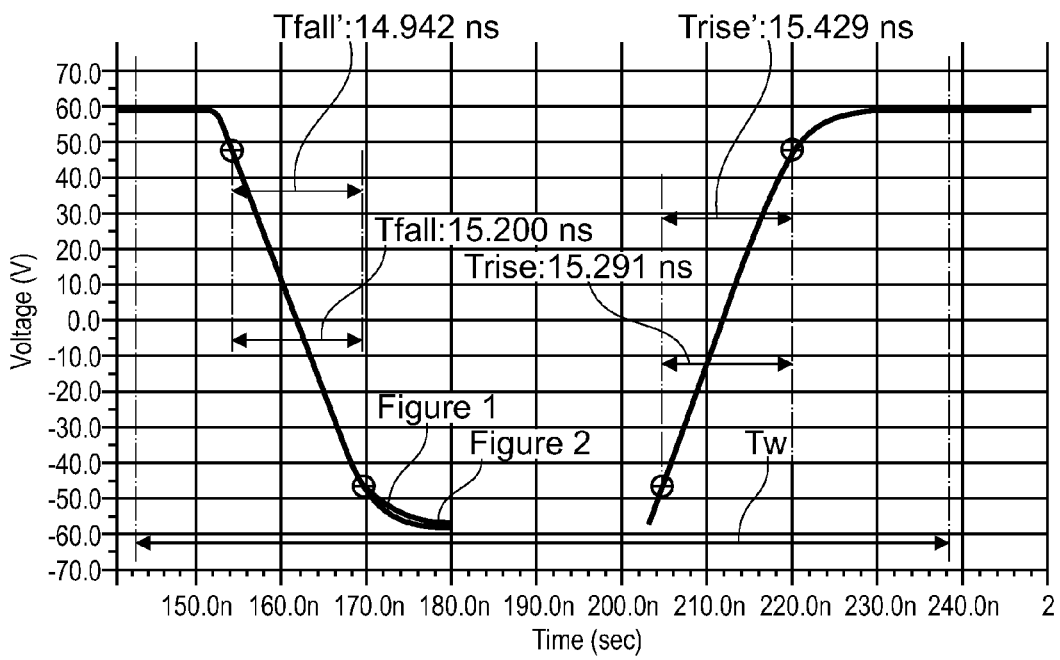
FIG. 3 graphically represents a simulation of the performances that can be obtained using the transmit/receive circuit of FIG. 1 and FIG. 2.

Referring now to FIG. 3, which graphically represents a simulation of the voltage performances that can be obtained at the node Xdcr in a measurement window Tw, with the transmit/receive circuit of FIG. 1 and FIG. 2, the structure proposed in FIG. 2 shows rise and fall times Trise and Tfall that are definitely more similar, i.e., about 15.2 nsec, as compared with an equivalent conventional structure, as shown in FIG. 1, in which the fall time Tfall' is 14.9 nsec and the rise time Trise' is 15.4 nsec.

Figure 4:
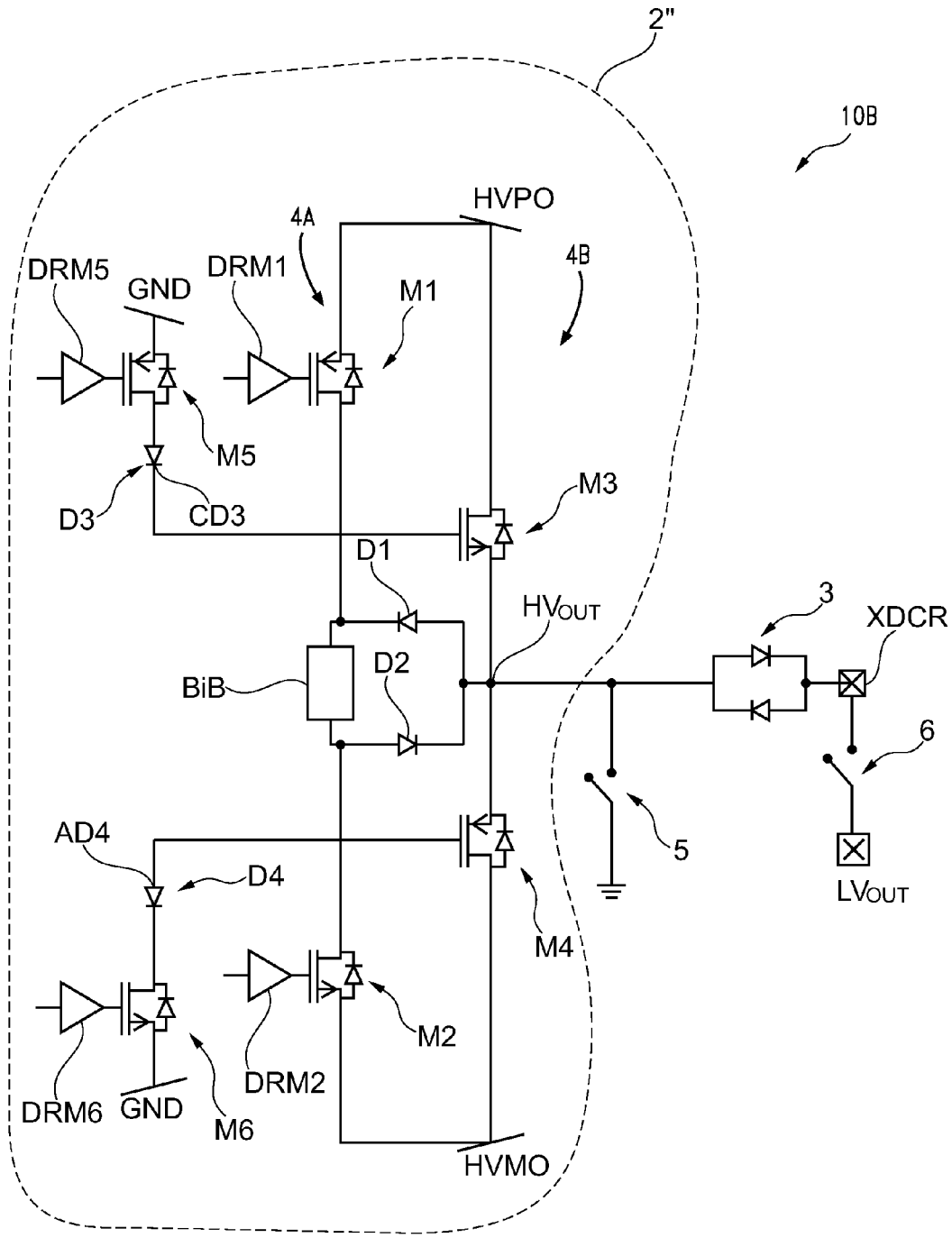
FIG. 4 shows a second embodiment of the transmit/receive circuit for ultrasound applications, comprising the high-voltage shifter for ultrasound applications of the present disclosure.

FIG. 4 shows a transmit/receive channel 10B for ultrasound applications according to a second embodiment of the present disclosure, comprising a high-voltage multi-level shifter 2" for ultrasound applications. The multi-level shifter 2" is shown to comprise, in addition to the transistors M1-M4, bidirectional battery BiB, diodes D1, D2, and drivers DRM1, DRM2:

a fifth switching transistor M5 and a third diode D3 coupled in series with each other between a voltage reference terminal having a fixed potential GND, i.e., equal to the ground potential, and the drain terminal of the first transistor M1, and a sixth switching transistor M6 and a fourth diode D4 coupled in series with each other between the voltage reference terminal having the fixed potential GND, and the drain terminal of the first transistor M2.

Particularly, the fifth and sixth switching transistors M5, M6 have respective control terminals connected to and controlled by third DRM5 and fourth DRM6 input drivers.

It shall be noted that the fifth switching transistor M5 is a high-voltage P-channel MOS transistor (HV PMOS), and the sixth switching transistor M6 is a high-voltage N-channel MOS transistor (HV NMOS).

In one aspect of the present disclosure, the fifth and sixth transistors M5, M6 are MOS transistors configured as having the same current-carrying capacity as the first, second, third and fourth switching transistors M1, M2, M3 and M4.

The fifth and sixth switching transistors M5, M6 can maintain a drain-source voltage that is one half that of the transistors M1, M2, M3 and M4, e.g., 100V.

Particularly, a cathode terminal CD3 of the third diode D3 is connected with the drain terminal of the first switching transistor M1 and an anode terminal AD4 of the fourth diode D4 is connected with the drain terminal of the second switching transistor M2.

Due to the presence of these diodes, the nodes A and C may not be connected to the ground during operation of the MOS transistors M1 and M2.

Concerning the operation of the shifter 2" as shown in FIG. 4, the considerations set forth with reference to FIGS. 2 and 2A apply.

Nevertheless, it shall be noted that in this embodiment (see FIG. 4) the presence of the switching transistors M5 and M6 provides a three-level shifter, as these transistors M5 and M6 introduce an intermediate or clamp level between the high voltage value (or HVP0) and the low voltage value (or HVM0).

For example the clamp value corresponds to the value of the reference voltage terminal with fixed potential, i.e., equal to the ground (GND).

It shall be further noted that, in the transition from the low voltage value (HVM0) to a clamp voltage value, the switching transistor M6 is off, and the switching transistor M5 is on, with the transistor M3, with which it shares the current.

Conversely, in the transition from the high voltage value (HVp0) to a clamp voltage value, the switching transistor M5 is off, and the switching transistor M6 is on, with the transistor M5, with which it shares the current.

It shall be also noted that the clamp circuit 5 allows clamp switching to end at a voltage value equal to the ground (or 0V), otherwise the node HVout would remain at a voltage +VDD or −VDD.

For this purpose, the switch implemented in the clamp device 5 may be very small, as it is not required to have a large current-carrying capacity.

Therefore, the shifter 2" of the present disclosure is found to provide much more symmetrical transitions to the clamp state (irrespective of whether the starting voltage value is positive or negative) as a PMOS transistor and a NMOS transistor are always on.

Furthermore, half of these transitions to the clamp state are carried out by the same MOS transistors that are used in the other switching processes.

Advantageously, the presence of the switching transistors M5 and M6 and the associated diodes is integrated in the structure of the shifter 2", which considerable reduces second harmonic distortion problems.

It shall be further noted that the shifter 2" covers a smaller area than a conventional shifter, because in clamp switching processes half of the current is always carried by the switching transistors M3 and M4; therefore the switching transistors M5 and M6 may be dimensioned to about half of a traditional clamp circuit.

Figure 5:
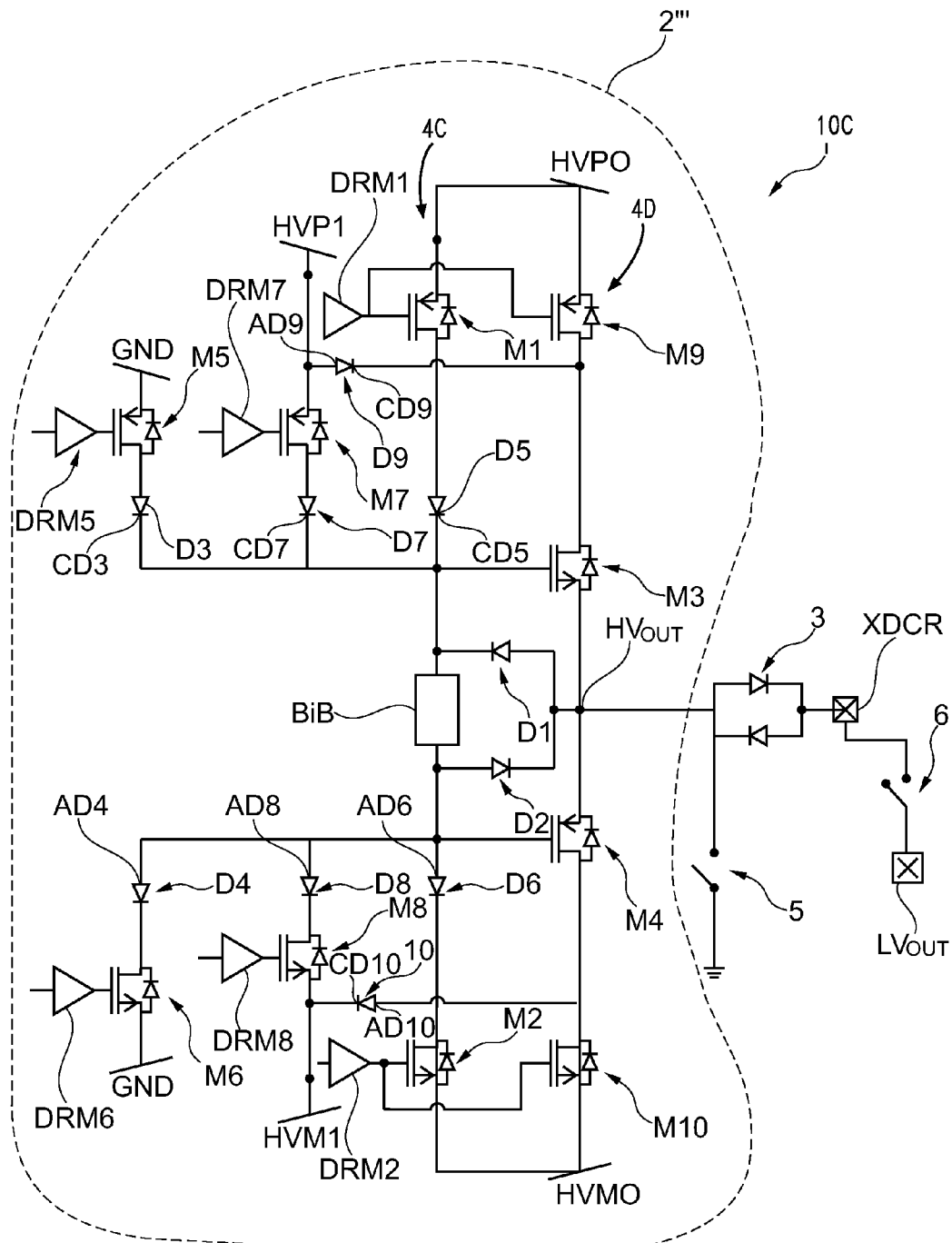
FIG. 5 shows a third embodiment of the transmit/receive circuit for ultrasound applications, comprising the high-voltage shifter for ultrasound applications of the present disclosure.

FIG. 5 shows a transmit/receive channel 10C for ultrasound applications according to a third embodiment of the present disclosure, comprising a high-voltage multi-level shifter 2'''. The multi-level shifter 2''' is shown to comprise a first branch 4C and a second branch 4D, the first branch 4C including:

the switching transistors M1, M2;
the bidirectional battery BiB;
a fifth diode D5 coupled with the first switching transistor M1, in which a cathode terminal CD5 of the diode D5 is connected with the control terminal of the third switching transistor M3; and
a sixth diode D6 coupled with the second switching transistor M2, in which an anode terminal AD6 of the sixth diode D6 is connected with said control terminal of said fourth switching transistor M4.

The multi-level shifter 2''' comprises a third branch coupled to the first and the second branches and having:

a seventh switching transistor M7 and a seventh diode D7, coupled in series with each other between a second higher reference voltage terminal HVP1 and the control terminal of the third transistor M3, in which a cathode terminal CD7 of the seventh diode D7 is connected with the control terminal of the third switching transistor M3; and
an eighth switching transistor M8 and an eighth diode D8, coupled in series with each other between a second lower reference voltage terminal HVM1 and the control terminal of the fourth switching transistor M4, in which an anode terminal AD8 of the eighth diode D8 is connected with the control terminal of the fourth switching transistor M4.

In one aspect of the present disclosure, the seventh and eighth transistors M7, M8 have respective control terminals, or gates, connected to and controlled by fifth DRM7 and sixth DRM8 input drivers.

Particularly, the seventh switching transistor M7 is a high-voltage switching transistor M1 is a high-voltage P-channel MOS transistor (HV PMOS), and the eighth switching transistor M8 is a high-voltage N-channel MOS transistor (HV NMOS).

The second branch 4D of the shifter 2''' comprises, in addition to the third and fourth switching transistors M3, M4:

a ninth switching transistor M9 coupled between the first higher voltage reference terminal HVP0 and the drain terminal of the third switching transistor M3, such ninth transistor M9 having a gate terminal connected with the gate terminal of said first transistor M1; and a tenth switching transistor M10 coupled between the first lower voltage reference terminal HVM0 and the drain terminal of the fourth switching transistor M4, such tenth transistor M10 having a gate terminal connected with the gate terminal of the second transistor M2.

It shall be noted that the ninth switching transistor M9 is a high voltage P-channel MOS transistor (HV PMOS), whose current-carrying capacity is higher than that of the first and/or third transistors M1, M3, whereas the tenth switching transistor M10 is a high-voltage N-channel MOS transistor (HV NMOS), whose current-carrying capacity is higher than that of the second and/or fourth transistors M2, M4.

For example, the ninth and tenth switching transistors M9, M10 have a drain-source voltage of 100V.

In one aspect of the present disclosure, the shifter 2''' comprises:

a ninth diode D9, in which a cathode terminal CD9 of the ninth diode D9 is connected with the drain terminal of the transistor M9 and an anode terminal AD9 of such ninth diode D9 is connected with the source terminal of the seventh transistor M7, and a tenth diode D10, in which a cathode terminal CD10 of the tenth diode D10 is connected with the drain terminal of the eighth transistor M8 and an anode terminal AD10 of the tenth diode D10 is connected with the drain terminal of the fourth transistor M4.

It shall be noted that, advantageously, the transistors M1, M4 and M7 are PMOS transistors and have the same current-carrying capacity, and the transistors M2, M3 and M8 are NMOS transistors and also have the same current-carrying capacity.

It shall be further noted that:

the second higher voltage reference terminal HVP1 has a voltage level that is lower than the voltage value of the first higher voltage reference terminal HVP0; and the second lower voltage reference terminal HVM1 has a voltage level that is higher than the voltage value of the second lower voltage reference terminal HVPM1. For example, the voltage level HVP1 is 60V and the voltage level HVM1 is −60V.

Concerning the operation of the shifter 2''' as shown in FIG. 5, the considerations set forth with reference to FIGS. 2 and 4 apply.

In this embodiment as shown in FIG. 5, it shall be noted that the presence of the transistors M7 and M8 allows the provision of a five-level shifter, and that the presence of the transistors M9 and M10 avoids current consumption, because when they are on, M7 and M8 are off, whereby the current that flows through M3 or M4 through the diodes D9 and D10 is directly supplied by the lower power supplies HPV1 or HVM1.

Due to the above, half of the switching processes of the shifter 2''' are carried out by a NMOS transistor, and the other half by a PMOS transistor, which will make the structure inherently symmetrical throughout the five levels and for clamp switching also.

Those skilled in the art will obviously appreciate that a number of changes and variants as described above may be made to fulfill particular requirements, without departure from the scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high-voltage multi-level shifter for ultrasound applications, comprising:
    a first branch having a high-voltage PMOS first transistor and a high-voltage NMOS second transistor electrically coupled with each other between a first higher voltage reference terminal and a first lower voltage reference terminal, said first and second transistors having respective drain terminals coupled together and respective control terminals;
    a second branch, electrically coupled in parallel to the first branch, having:
        a high-voltage NMOS third transistor electrically coupled between said first higher voltage reference terminal and an output node, and
        a high-voltage PMOS fourth transistor electrically coupled between said output node and said first lower voltage reference terminal,
        said third and fourth transistors having respective control terminals configured to be controlled by said drain terminals of said first transistor and said second transistor respectively, and
        said first and fourth transistors having the same current-carrying capacity, and said second and third transistors being configured as having the same current-carrying capacity; and
    a bidirectional battery coupled between said drain terminals of said first transistor and said second transistor and configured to supply first and second voltage values having the same magnitude and different polarities;
    said bidirectional battery being configured to control said fourth transistor according to the first voltage value when said first transistor is turned on; and
    said bidirectional battery being configured to control said third transistor being controlled according to the second voltage value when said second transistor is turned on.

2. The high-voltage multi-level shifter as claimed in claim 1, comprising:
    a first low-voltage diode having a cathode terminal coupled to said drain terminal of said first transistor and an anode terminal coupled to said output node; and
    a second low-voltage diode having a cathode terminal coupled to said output node and an anode terminal coupled to said drain terminal of said second switching transistor,
    wherein said first voltage value is equal to said control voltage less a voltage across said first diode and the second voltage value is equal to the control voltage less a voltage across said second diode.

3. The high-voltage multi-level shifter as claimed in claim 1, wherein said bidirectional battery comprises a plurality of low-voltage diodes in an antiparallel arrangement.

4. The high-voltage multi-level shifter as claimed in claim 1, wherein said first, second, third and fourth transistors are MOS transistors configured as having the same current-carrying capacity.

5. The high-voltage multi-level shifter as claimed in claim 1, comprising:
a fifth transistor and a third diode coupled in series with each other between a voltage reference terminal and said drain terminal of said first transistor;
a sixth transistor and a fourth diode coupled in series with each other between said voltage reference terminal and said drain terminal of said second transistor; and
third and fourth input drivers configured to respectively control respective control terminals of said fifth and sixth transistors;
said fifth transistor being a high-voltage P-channel MOS transistor, and said sixth transistor being a high-voltage N-channel MOS transistor;
said fifth and sixth transistors being configured as having a current-carrying capacity lower than a current-carrying capacity of said first, second, third and fourth transistors.

6. The high voltage multi-level shifter as claimed in claim 5, wherein the current-carrying capacity of said fifth and sixth transistors is half the current-carrying capacity of said first, second, third and fourth transistors.

7. The high-voltage multi-level shifter as claimed in claim 5, wherein:
a cathode terminal of said third diode is coupled with said drain terminal of said first switching transistor;
an anode terminal of said fourth diode is coupled with said drain terminal of said second switching transistor.

8. The high-voltage multi-level shifter as claimed in claim 5, comprising:
a fifth diode coupled with said first switching transistor, in which a cathode terminal of said fifth diode is connected with said control terminal of said third switching transistor;
a sixth diode coupled with said second switching transistor, in which an anode terminal of said sixth diode is connected with said control terminal of said fourth switching transistor;
a third branch coupled to the first and second branches, and having:
a seventh transistor and a seventh diode, coupled in series with each other between a second higher reference voltage terminal and said control terminal of said third transistor, in which a cathode terminal of the seventh diode is coupled with said control terminal of said third transistor;
an eighth transistor and an eighth diode, coupled with each other between a second lower reference voltage terminal and said control terminal of said fourth switching transistor, in which an anode terminal of said eighth diode is coupled with said control terminal of said fourth transistor;
said seventh and eighth transistors having respective gates coupled to and controlled by fifth and sixth input drivers;
said seventh transistor being a high-voltage P-channel MOS transistor, and said eighth transistor being a high-voltage N-channel MOS transistor.

9. The high-voltage multi-level shifter as claimed in claim 8, wherein said second branch comprises:
a ninth transistor coupled between said first higher voltage reference terminal and said drain terminal of said third transistor, said ninth transistor having a gate terminal connected with said gate terminal of said first transistor;
a tenth transistor coupled in series between said first lower voltage reference terminal and said drain terminal of said fourth transistor, said tenth transistor having a gate terminal connected with said gate terminal of said second transistor.

10. The high-voltage multi-level shifter as claimed in claim 9, wherein:
said ninth transistor is a high-voltage P-channel MOS transistor having a current-carrying capacity that is lower than at least one of said first and third transistors;
said tenth transistor is a high-voltage N-channel MOS transistor having a current-carrying capacity that is lower than at least one of said second and fourth transistors.

11. The high-voltage multi-level shifter as claimed in claim 9, comprising:
a ninth diode having a cathode terminal coupled with a drain terminal of said ninth transistor and an anode terminal coupled with a source terminal of said seventh transistor,
a tenth diode having a cathode terminal coupled with a drain terminal of said eighth transistor and an anode terminal coupled with a drain terminal of said fourth transistor.

12. A transmit/receive channel for ultrasound applications comprising:
a connection terminal configured to be coupled to a piezoelectric transducer;
a low-voltage output terminal;
an anti-noise block;
a receive switch coupled between said connection terminal and a low-voltage output terminal and configured to pass a receive signal from the connection terminal to the low-voltage output terminal; and
a high-voltage multi-level shifter that includes:
an output terminal, the anti-noise block being coupled between the output terminal of the high-voltage multi-level shifter and the connection terminal;
a first branch having a high-voltage PMOS first transistor and a high-voltage NMOS second transistor electrically coupled with each other between a first higher voltage reference terminal and a first lower voltage reference terminal, said first and second transistors having respective drain terminals coupled together and respective control terminals;
first and second input drivers configured to control the control terminals of the first and second transistors,
a second branch, electrically coupled in parallel to the first branch, having:
a high-voltage NMOS third transistor electrically coupled between said first higher voltage reference terminal and an output node, and
a high-voltage PMOS fourth transistor electrically coupled between said output node and said first lower voltage reference terminal,
said third and fourth transistors having respective control terminals configured to be controlled by said drain terminals of said first transistor and said second transistor respectively, and
said first and fourth transistors having the same current-carrying capacity, and said second and third transistors being configured as having the same current-carrying capacity; and a bidirectional battery coupled between said drain terminals of said first transistor and said second transistor and configured to supply first and second voltage values having the same magnitude and different polarities;
said bidirectional battery being configured to control said fourth transistor according to the first voltage value when said first transistor is turned on; and
said bidirectional battery being configured to control said third transistor being controlled according to the second voltage value when said second transistor is turned on.

13. The transmit/receive channel as claimed in claim 12, the high-voltage multi-level shifter including:
a first low-voltage diode having a cathode terminal coupled to said drain terminal of said first transistor and an anode terminal coupled to said output node; and
a second low-voltage diode having a cathode terminal coupled to said output node and an anode terminal coupled to said drain terminal of said second switching transistor,
wherein said first voltage value is equal to said control voltage less a voltage across said first diode and the second voltage value is equal to the control voltage less a voltage across said second diode.

14. The transmit/receive channel as claimed in claim 12, wherein said bidirectional battery comprises a plurality of low-voltage diodes in an antiparallel arrangement.

15. The transmit/receive channel as claimed in claim 12, the high-voltage multi-level shifter including:
a fifth transistor and a third diode coupled in series with each other between a voltage reference terminal and said drain terminal of said first transistor;
a sixth transistor and a fourth diode coupled in series with each other between said voltage reference terminal and said drain terminal of said second transistor; and
third and fourth input drivers configured to respectively control respective control terminals of said fifth and sixth transistors;
said fifth transistor being a high-voltage P-channel MOS transistor, and said sixth transistor being a high-voltage N-channel MOS transistor;
said fifth and sixth transistors being configured as having a current-carrying capacity lower than a current-carrying capacity of said first, second, third and fourth transistors.

16. The transmit/receive channel as claimed in claim 15, wherein:
a cathode terminal of said third diode is coupled with said drain terminal of said first switching transistor; and
an anode terminal of said fourth diode is coupled with said drain terminal of said second switching transistor.

17. The transmit/receive channel as claimed in claim 15, the high-voltage multi-level shifter including:
a fifth diode coupled with said first switching transistor, in which a cathode terminal of said fifth diode is connected with said control terminal of said third switching transistor;
a sixth diode coupled with said second switching transistor, in which an anode terminal of said sixth diode is connected with said control terminal of said fourth switching transistor;
a third branch coupled to the first and second branches, and having:
a seventh transistor and a seventh diode, coupled in series with each other between a second higher reference voltage terminal and said control terminal of said third transistor, in which a cathode terminal of the seventh diode is coupled with said control terminal of said third transistor;
an eighth transistor and an eighth diode, coupled with each other between a second lower reference voltage terminal and said control terminal of said fourth switching transistor, in which an anode terminal of said eighth diode is coupled with said control terminal of said fourth transistor;
said seventh and eighth transistors having respective gates coupled to and controlled by fifth and sixth input drivers;
said seventh transistor being a high-voltage P-channel MOS transistor, and said eighth transistor being a high-voltage N-channel MOS transistor.

18. The transmit/receive channel as claimed in claim 17, wherein said second branch comprises:
a ninth transistor coupled between said first higher voltage reference terminal and said drain terminal of said third transistor, said ninth transistor having a gate terminal connected with said gate terminal of said first transistor;
a tenth transistor coupled in series between said first lower voltage reference terminal and said drain terminal of said fourth transistor, said tenth transistor having a gate terminal connected with said gate terminal of said second transistor.

19. The transmit/receive channel as claimed in claim 18, the high-voltage multi-level shifter including:
a ninth diode having a cathode terminal coupled with a drain terminal of said ninth transistor and an anode terminal coupled with a source terminal of said seventh transistor,
a tenth diode having a cathode terminal coupled with a drain terminal of said eighth transistor and an anode terminal coupled with a drain terminal of said fourth transistor.

20. A multi-level shifter, comprising:
a first branch having a first transistor and a second transistor electrically coupled with each other between a first higher voltage reference terminal and a first lower voltage reference terminal, said first and second transistors having respective control terminals;
a second branch, electrically coupled in parallel to the first branch, and including:
a third transistor electrically coupled between said first higher voltage reference terminal and an output node, and
a fourth transistor electrically coupled between said output node and said first lower voltage reference terminal; and
a bidirectional battery coupled between said first transistor and said second transistor and configured to supply first and second voltage values having the same magnitude and different polarities, said bidirectional battery being configured to control said fourth transistor according to the first voltage value when said first transistor is turned on, and said bidirectional battery being configured to control said third transistor according to the second voltage value when said second transistor is turned on.

21. The multi-level shifter as claimed in claim 20, comprising:
a first diode having a cathode terminal coupled to said drain terminal of said first transistor and an anode terminal coupled to said output node; and
a second diode having a cathode terminal coupled to said output node and an anode terminal coupled to said drain terminal of said second switching transistor.

22. The multi-level shifter as claimed in claim 20, wherein said bidirectional battery comprises a plurality of low-voltage diodes in an antiparallel arrangement.

23. The multi-level shifter as claimed in claim 20, comprising:
   a fifth transistor and a third diode coupled in series with each other between a voltage reference terminal and said drain terminal of said first transistor;
   a sixth transistor and a fourth diode coupled in series with each other between said voltage reference terminal and said drain terminal of said second transistor; and
   third and fourth input drivers configured to respectively control respective control terminals of said fifth and sixth transistors;
   said fifth and sixth transistors being configured as having a current-carrying capacity lower than a current-carrying capacity of said first, second, third and fourth transistors.

* * * * *